United States Patent
Yamaguchi et al.

(10) Patent No.: US 9,593,412 B2
(45) Date of Patent: Mar. 14, 2017

(54) DEPOSITION APPARATUS AND ELECTRONIC DEVICE MANUFACTURING METHOD

(71) Applicant: CANON ANELVA CORPORATION, Kawasaki-shi (JP)

(72) Inventors: Nobuo Yamaguchi, Tama (JP); Kimiko Mashimo, Hachioji (JP); Shinya Nagasawa, Hino (JP)

(73) Assignee: Canon Anelva Corporation, Kawasaki-shi (JP)

( * ) Notice: Subject to any disclaimer, the term of this patent is extended or adjusted under 35 U.S.C. 154(b) by 510 days.

(21) Appl. No.: 14/069,754

(22) Filed: Nov. 1, 2013

(65) Prior Publication Data

US 2014/0054164 A1 Feb. 27, 2014

Related U.S. Application Data

(60) Division of application No. 12/781,903, filed on May 18, 2010, now Pat. No. 8,663,437, which is a (Continued)

(30) Foreign Application Priority Data

Nov. 28, 2008 (JP) ................. 2008-305567

(51) Int. Cl.
   C23C 14/00 (2006.01)
   C23C 14/35 (2006.01)
   (Continued)

(52) U.S. Cl.
   CPC ........ *C23C 14/564* (2013.01); *C23C 14/0036* (2013.01); *C23C 14/35* (2013.01);
   (Continued)

(58) Field of Classification Search
   CPC ... C23C 14/0036; C23C 14/564; C23C 14/35; H01J 37/3447; H01J 37/34; H01J 37/3464
   See application file for complete search history.

(56) References Cited

U.S. PATENT DOCUMENTS

| | | |
|---|---|---|
| 5,223,112 A | 6/1993 | Tepman |
| 5,772,858 A | 6/1998 | Tepman |

(Continued)

FOREIGN PATENT DOCUMENTS

| | | |
|---|---|---|
| JP | 63-60278 | 3/1988 |
| JP | 63-103059 A | 5/1988 |

(Continued)

*Primary Examiner* — Michael Band
(74) *Attorney, Agent, or Firm* — Fitzpatrick, Cella, Harper & Scinto

(57) ABSTRACT

A deposition apparatus includes a shutter storage unit which is connected to a processing chamber via an opening and stores a shutter in the retracted state into an exhaust chamber, and a shield member which is formed around the opening of the shutter storage unit and covers the exhaust port of the exhaust chamber. The shield member has, at a position of a predetermined height between the opening of the shutter storage unit and a deposition unit, the first exhaust path which communicates with the exhaust port of the exhaust chamber.

2 Claims, 11 Drawing Sheets

Related U.S. Application Data continuation of application No. PCT/JP2009/006384, filed on Nov. 26, 2009.

(51) Int. Cl.
   *C23C 14/56* (2006.01)
   *H01J 37/34* (2006.01)

(52) U.S. Cl.
   CPC ...... *H01J 37/3447* (2013.01); *H01J 37/3464* (2013.01); *H01J 37/34* (2013.01)

(56) References Cited

U.S. PATENT DOCUMENTS

| | | |
|---|---|---|
| 6,444,103 B1 | 9/2002 | Moslehi et al. |
| 6,736,946 B2 | 5/2004 | Hixson et al. |
| 7,008,517 B2 | 3/2006 | Feltsman |
| 8,147,664 B2 | 4/2012 | Yamaguchi et al. |
| 2008/0264775 A1 | 10/2008 | Kitano et al. |
| 2010/0326818 A1* | 12/2010 | Ikemoto ............... C23C 14/0063 204/192.17 |
| 2012/0325651 A1* | 12/2012 | Yamaguchi ............. C23C 14/34 204/192.15 |

FOREIGN PATENT DOCUMENTS

| | | |
|---|---|---|
| JP | 63-247361 A | 10/1988 |
| JP | 1-208458 A | 8/1989 |
| JP | 6-338493 A | 12/1994 |
| JP | 8-148436 A | 6/1996 |
| JP | 11-350126 A | 12/1999 |
| JP | 2001-220668 A | 8/2001 |
| JP | 2002-302763 A | 10/2002 |
| JP | 2004-193360 A | 7/2004 |

* cited by examiner

F I G. 11

| | GAS SPIKE | PLASMA IGNITION | PRE-SPUTTERING | CONDITIONING 1 | GAS SPIKE | PLASMA IGNITION | PRE-SPUTTERING | CONDITIONING 2 |
|---|---|---|---|---|---|---|---|---|
| STEP NUMBER (S) | 1101 | 1102 | 1103 | 1104 | 1105 | 1106 | 1107 | 1108 |
| SET TIME (SEC) | 0.1 | 2.0 | 5.0 | 240.0 | 5.0 | 2.0 | 5.0 | 180.0 |
| TARGET SHUTTER | CLOSED | CLOSED | CLOSED | OPEN | CLOSED | CLOSED | CLOSED | OPEN |
| SUBSTRATE SHUTTER | CLOSED | CLOSED | CLOSED | CLOSED | CLOSED | CLOSED | CLOSED | CLOSED |
| TARGET APPLICATION POWER (W) | 0 | 1000 | 1000 | 1000 | 0 | 750 | 750 | 750 |
| ARGON FLOW RATE (SCCM) | 400 | 400 | 100 | 100 | 200 | 200 | 10 | 10 |
| NITROGEN FLOW RATE (SCCM) | 0 | 0 | 0 | 0 | 10 | 10 | 10 | 10 |

FIG. 12

| | EXECUTION TIMING | DETERMINATION CONDITION |
|---|---|---|
| CONDITIONING START CONDITION 1 | CONDITIONING IS EXECUTED AFTER LOT PROCESSING | TOTAL NUMBER OF PROCESSED SUBSTRATES IS USED AS SET VALUE (1201) |
| CONDITIONING START CONDITION 2 | CONDITIONING IS EXECUTED BY INTERRUPTING LOT PROCESSING | |
| CONDITIONING START CONDITION 3 | CONDITIONING IS EXECUTED AFTER LOT PROCESSING | TOTAL NUMBER OF PROCESSED LOTS IS USED AS SET VALUE (1202) |
| CONDITIONING START CONDITION 4 | CONDITIONING IS EXECUTED BY INTERRUPTING LOT PROCESSING | |
| CONDITIONING START CONDITION 5 | CONDITIONING IS EXECUTED AFTER LOT PROCESSING | TOTAL THICKNESS OF FILM DEPOSITED BY DEPOSITION APPARATUS IS USED AS SET VALUE (1203) |
| CONDITIONING START CONDITION 6 | CONDITIONING IS EXECUTED BY INTERRUPTING LOT PROCESSING | |
| CONDITIONING START CONDITION 7 | CONDITIONING IS EXECUTED AFTER LOT PROCESSING | INTEGRAL POWER TO TARGET IS USED AS SET VALUE (1204) |
| CONDITIONING START CONDITION 8 | CONDITIONING IS EXECUTED BY INTERRUPTING LOT PROCESSING | |
| CONDITIONING START CONDITION 9 | CONDITIONING IS EXECUTED AFTER LOT PROCESSING | INTEGRAL POWER PER SHIELD IS USED AS SET VALUE (1205) |
| CONDITIONING START CONDITION 10 | CONDITIONING IS EXECUTED BY INTERRUPTING LOT PROCESSING | |
| CONDITIONING START CONDITION 11 | CONDITIONING IS EXECUTED AFTER LOT PROCESSING | STANDBY TIME IS USED AS SET VALUE (1206) |
| CONDITIONING START CONDITION 12 | CONDITIONING IS EXECUTED BY INTERRUPTING LOT PROCESSING | |
| CONDITIONING START CONDITION 13 | CONDITIONING IS EXECUTED BEFORE LOT PROCESSING | CHANGE OF DEPOSITION CONDITIONS (1207) |

DEPOSITION APPARATUS AND ELECTRONIC DEVICE MANUFACTURING METHOD

CROSS-REFERENCE TO RELATED APPLICATIONS

This application is a divisional of U.S. patent application Ser. No. 12/781,903, filed May 18, 2010, which is a continuation of International Application No. PCT/JP2009/006384, filed Nov. 26, 2009, which claims the benefit of Japanese Patent Application No. 2008-305567, filed Nov. 28, 2008. The contents of the aforementioned applications are incorporated herein by reference in their entireties.

TECHNICAL FIELD

The present invention relates to a deposition apparatus used to deposit a material in the manufacturing process of an electronic device such as a magnetic storage medium, semiconductor device, or display device, and an electronic device manufacturing method using the deposition apparatus.

BACKGROUND ART

Advanced miniaturization of semiconductor elements is demanding higher standards for deposition characteristics. For example, a gate insulating film is requested to be very thin. A thin electrode film or the like needs to be stably formed on a very thin insulating film. Also, the impurity level needs to be decreased because an impurity such as carbon in a film or at the interface between thin films affects the element performance.

A sputtering method used as one of deposition methods can achieve high-quality deposition because the raw material does not contain an impurity such as carbon, unlike a CVD method. The sputtering method is useful because it does not use a hazardous organometallic material, unlike CVD, and need not execute abatement processing for a by-product and virgin raw material.

For example, in a sputtering deposition method of depositing a thin film on a substrate made of silicon or the like (to be referred to as a "substrate"), a target holder in an evacuated vacuum chamber holds a vapor deposition source called a target made of a material to be deposited on a substrate. A substrate holder in the vacuum chamber supports the substrate. Gas such as Ar is introduced into the vacuum chamber, and a high voltage is applied to the target, generating a plasma. According to the sputtering deposition method, the target material is attached to the substrate supported by the substrate holder using the sputtering phenomenon of the target by charged particles in the discharge plasma. In general, positive ions in the plasma enter a negatively charged target, sputtering atoms and molecules of the target material from it. These atoms and molecules are called sputtered particles. The sputtered particles attach to the substrate, forming a target material-containing film on the substrate.

In the sputtering deposition apparatus, a freely openable shield plate called a shutter is generally interposed between a target and a substrate. With this shutter, the timing to start deposition is controlled not to start deposition processing until the plasma state in the vacuum chamber is stabilized. More specifically, the shutter is closed not to deposit a film on a substrate until a plasma generated by applying a high voltage to a target is stabilized. After the plasma is stabilized, the shutter is opened to start deposition. By controlling the start of deposition using the shutter in this way, a film can be deposited on a substrate with good controllability using the stable plasma, so a high-quality film can be deposited.

A plasma processing apparatus disclosed in patent reference 1 includes, in a vacuum chamber, a wafer holder having a plate for supporting a wafer and a plurality of wafer lift pins, a moving shutter which moves parallel to a wafer, and a shutter storage unit for storing the moving shutter while a substrate is processed using a plasma.

CITATION LIST

Patent Literature

Patent Reference 1: Japanese Patent Laid-Open No. 2004-193360

SUMMARY OF INVENTION

Problems that the Invention is to Solve

However, the conventional plasma processing apparatus disclosed in patent reference 1 suffers fluctuations of the pressure in the vacuum chamber as a result of a change of the exhaust conductance of gas exhausted from the vacuum chamber by the opening/closing operation of the shutter. The pressure fluctuations cause plasma variations. The shutter is opened at the start of deposition, as described above. Thus, fluctuations of the pressure make the plasma unstable at the start of deposition.

Means of Solving the Problems

The present invention has been made to solve the above problems, and has as its object to provide a deposition technique capable of performing high-quality deposition by suppressing a change of the exhaust conductance from a vacuum chamber to an exhaust chamber and stabilizing the pressure in the vacuum chamber when the shutter operates.

To achieve the above object, according to one aspect of the present invention, there is provided a deposition apparatus comprising:

a processing chamber configured to perform deposition processing, an exhaust chamber connected to the processing chamber via an exhaust port, an exhaust device connected to the exhaust chamber and evacuates the processing chamber via the exhaust chamber, a substrate holder disposed in the processing chamber and supports a substrate, a deposition unit disposed in the processing chamber and deposits a film on the substrate, a shutter configured to move to a shielding state in which the shutter shields the substrate holder and the deposition unit from each other, or a retracted state in which the shutter is retracted from between the substrate holder and the deposition unit, a driving unit configured to drive the shutter to set the shutter in the shielding state or the retracted state, a shutter storage unit connected to the processing chamber via an opening and stores the shutter in the retracted state into the exhaust chamber, and a shield member formed around the opening of the shutter storage unit and configured to cover the exhaust port of the exhaust chamber, wherein the shield member has, at a position of a predetermined height between the opening of the shutter storage unit and the deposition unit, a first exhaust path which communicates with the exhaust port of the exhaust chamber.

According to another aspect of the present invention, there is provided an electronic device manufacturing method using a deposition apparatus including:

a processing chamber configured to perform deposition processing, an exhaust chamber connected to the processing chamber via an exhaust port, an exhaust device connected to the exhaust chamber and evacuates the processing chamber via the exhaust chamber, a substrate holder disposed in the processing chamber and supports a substrate, a deposition unit disposed in the processing chamber, a shutter configured to move to a shielding state in which the shutter shields the substrate holder and the deposition unit from each other, or a retracted state in which the shutter is retracted from between the substrate holder and the deposition unit, a driving unit configured to drive the shutter to set the shutter in the shielding state or the retracted state, a shutter storage unit connected to the processing chamber via an opening and stores the shutter in the retracted state into the exhaust chamber, and a shield member formed around the opening of the shutter storage unit and configured to cover the exhaust port of the exhaust chamber, the shield member having, at a position of a predetermined height between the opening of the shutter storage unit and the deposition unit, a first exhaust path which communicates with the exhaust port of the exhaust chamber, the method comprising:

a first step of setting the shutter in the shielding state by the driving unit, a second step of depositing a film by the deposition unit after the first step while maintaining the shielding state, and a third step of setting the shutter in the retracted state by the driving unit after the second step, and depositing a film by the deposition unit on the substrate supported by the substrate holder.

Effects of the Invention

The present invention can provide a deposition technique capable of performing high-quality deposition by suppressing a change of the exhaust conductance from a vacuum chamber to an exhaust chamber and stabilizing the pressure in the vacuum chamber when the shutter operates.

Further features of the present invention will become apparent from the following description of exemplary embodiments with reference to the accompanying drawings.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 11 is a table showing procedures when performing conditioning using the sputtering deposition apparatus according to the embodiment of the present invention;

FIG. 12 is a table for explaining exemplary conditioning start conditions; and

DESCRIPTION OF EMBODIMENTS

An exemplary preferred embodiment of the present invention will now be described in detail with reference to the accompanying drawings. It should be noted that building elements set forth in the following embodiment are merely examples, and the technical scope of the invention is defined by the scope of the appended claims, and is not limited by the individual embodiment below.

Figure 1:
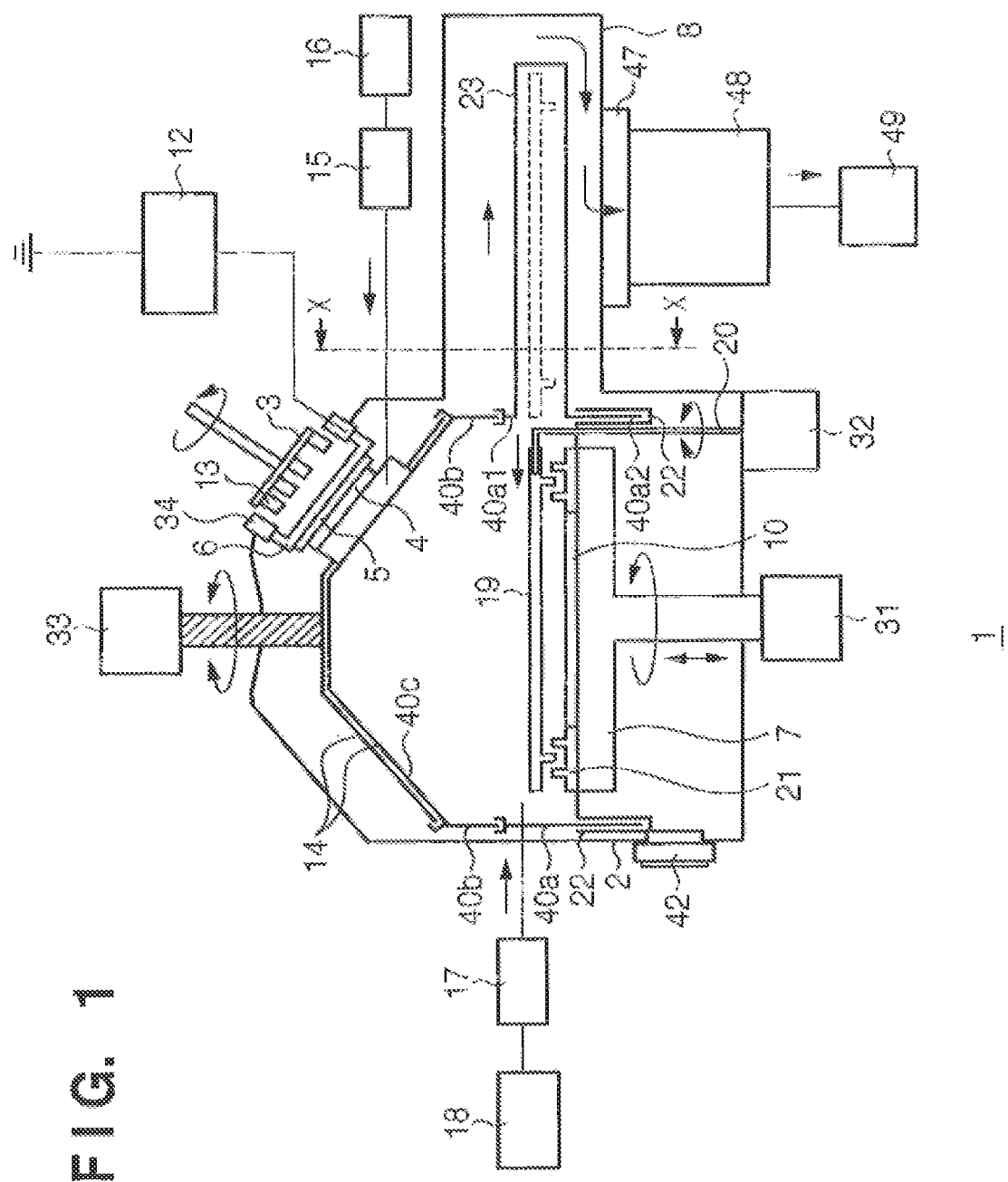
FIG. 1 is a schematic view of a sputtering deposition apparatus according to an embodiment of the present invention.

The overall arrangement of a sputtering deposition apparatus 1 will be explained with reference to FIG. 1. FIG. 1 is a schematic view of the deposition apparatus 1 according to the embodiment of the present invention. The embodiment will exemplify a sputtering deposition apparatus as the deposition apparatus. However, the gist of the present invention is not limited to this example and is also applicable to, for example, a CVD apparatus and PVD apparatus.

The sputtering deposition apparatus 1 includes a vacuum chamber 2 capable of evacuation, an exhaust chamber 8 arranged adjacent to the vacuum chamber 2 via an exhaust port 301 (see FIG. 3), and an exhaust device which evacuates the vacuum chamber 2 via the exhaust chamber 8. The exhaust device has a turbo molecular pump 48. The turbo molecular pump 48 of the exhaust device is further connected to a dry vacuum pump 49. The exhaust device is arranged below the exhaust chamber 8 in order to minimize the footprint of the whole apparatus (area occupied by it).

The vacuum chamber 2 incorporates a target holder 6 which holds a target 4 via a back plate 5. A target shutter 14 is arranged near the target holder 6 to shield the target holder 6. The target shutter 14 has a rotating shutter structure. The target shutter 14 functions as a shield member for setting a closed state (shielding state) in which the target shutter 14 shields a substrate holder 7 and the target holder 6 from each other, or an open state (retracted state) in which it releases the space between the substrate holder 7 and the target holder 6. The target shutter 14 is connected to a target shutter driving mechanism 33 for opening/closing the target shutter 14.

The vacuum chamber 2 incorporates the substrate holder 7 for holding a substrate, a substrate shutter 19 interposed between the substrate holder 7 and the target holder 6, and a substrate shutter driving mechanism 32 which drives the substrate shutter 19 to open and close. The substrate shutter 19 is arranged near the substrate holder 7. The substrate shutter 19 functions as a shield member for setting a closed state in which the substrate shutter 19 shields the substrate holder 7 and target holder 6 from each other, or an open state in which it releases the space between them.

The vacuum chamber 2 further comprises an inert gas introduction system 15 for introducing inert gas (e.g., argon gas) into the vacuum chamber 2, a reactive gas introduction system 17 for introducing reactive gas (e.g., oxygen or nitrogen gas), and a pressure gauge (not shown) for measuring the pressure of the vacuum chamber 2.

The inert gas introduction system 15 is connected to an inert gas supply source (gas cylinder) 16 for supplying inert gas. The inert gas introduction system 15 is made up of a pipe for introducing inert gas, a massflow controller for controlling the flow rate of inert gas, valves for stopping or starting the flow of gas, and if necessary, a pressure reducing valve, filter, and the like. The inert gas introduction system 15 can stably supply gas at a flow rate designated by a control device (not shown). Inert gas is supplied from the inert gas supply source 16, and after its flow rate is controlled by the inert gas introduction system 15, introduced near the target 4.

The reactive gas introduction system 17 is connected to a reactive gas supply source (gas cylinder) 18 for supplying reactive gas. The reactive gas introduction system 17 is made up of a pipe for introducing reactive gas, a massflow controller for controlling the flow rate of inert gas, valves for stopping or starting the flow of gas, and if necessary, a pressure reducing valve, filter, and the like. The reactive gas introduction system 17 can stably supply gas at a flow rate designated by a control device (not shown). Reactive gas is supplied from the reactive gas supply source 18, and after its flow rate is controlled by the reactive gas introduction system 17, introduced near the substrate holder 7 which holds a substrate 10 (to be described later).

Inert gas and reactive gas are introduced into the vacuum chamber 2, used to form a film, and then exhausted by the turbo molecular pump 48 and dry vacuum pump 49 via the exhaust chamber 8.

The inner surface of the vacuum chamber 2 is grounded. The inner surface of the vacuum chamber 2 between the target holder 6 and the substrate holder 7 includes a cylindrical shield member (shields 40a and 40b) grounded, and a shield 40c at the ceiling that covers the inner surface of the vacuum chamber 2 except for a target holder portion facing the substrate holder 7 (the shields 40a, 40b, and 40c will also be simply referred to as "shields"). The shield is a member which is formed separately from the vacuum chamber 2 to prevent sputtered particles from directly attaching to the inner surface of the vacuum chamber 2 and protect the inner surface of the vacuum chamber, and which is exchangeable periodically.

The exhaust chamber 8 connects the vacuum chamber 2 and turbo molecular pump 48. A main valve 47 is interposed between the exhaust chamber 8 and the turbo molecular pump 48 to disconnect the sputtering deposition apparatus 1 from the turbo molecular pump 48 in maintenance.

Figure 2:
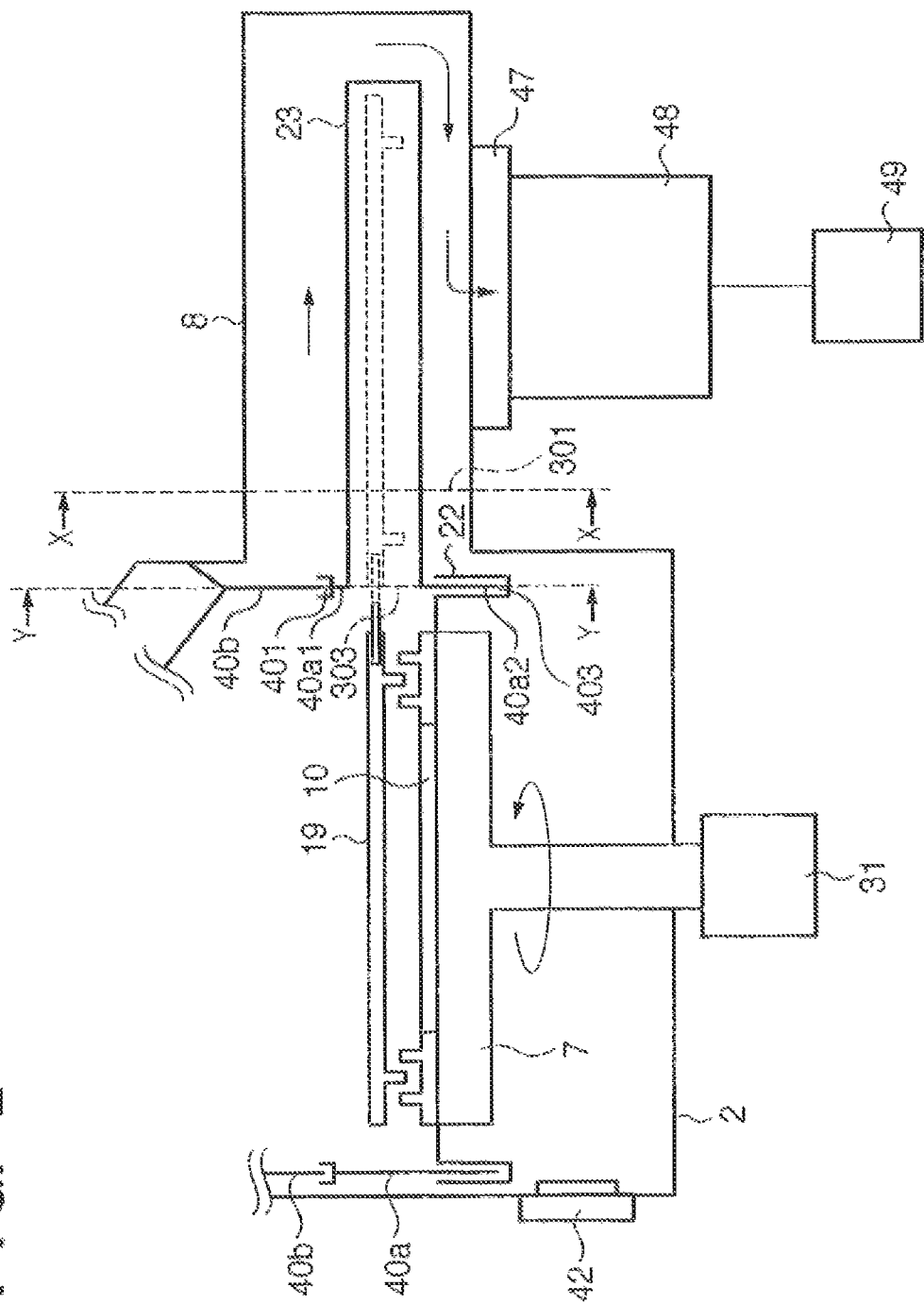
FIG. 2 is an enlarged view for explaining in detail an exhaust chamber in FIG. 1.
Figure 3:
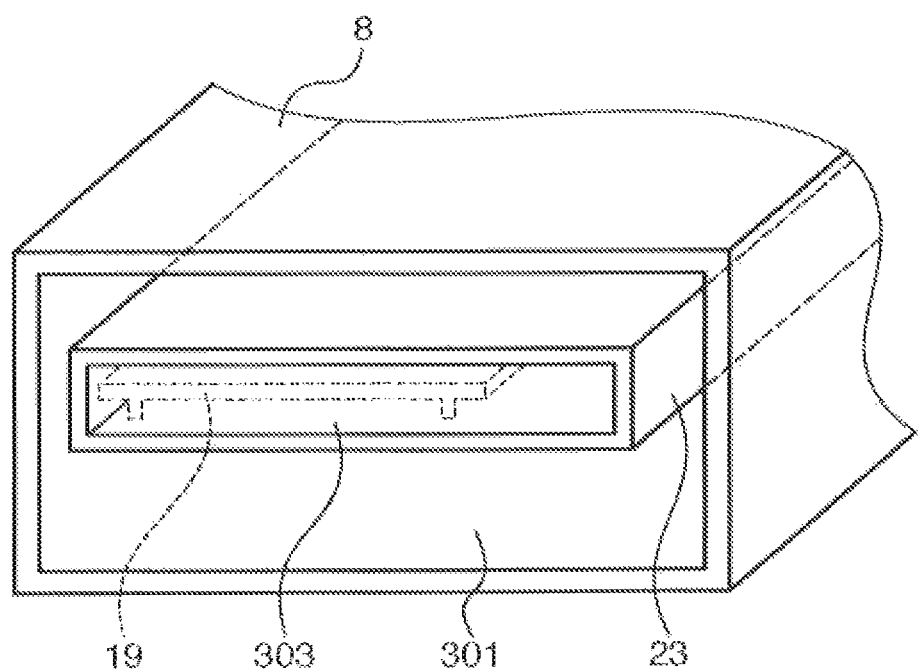
FIG. 3 is a sectional view taken along X-X in FIG. 2.
Figure 4:
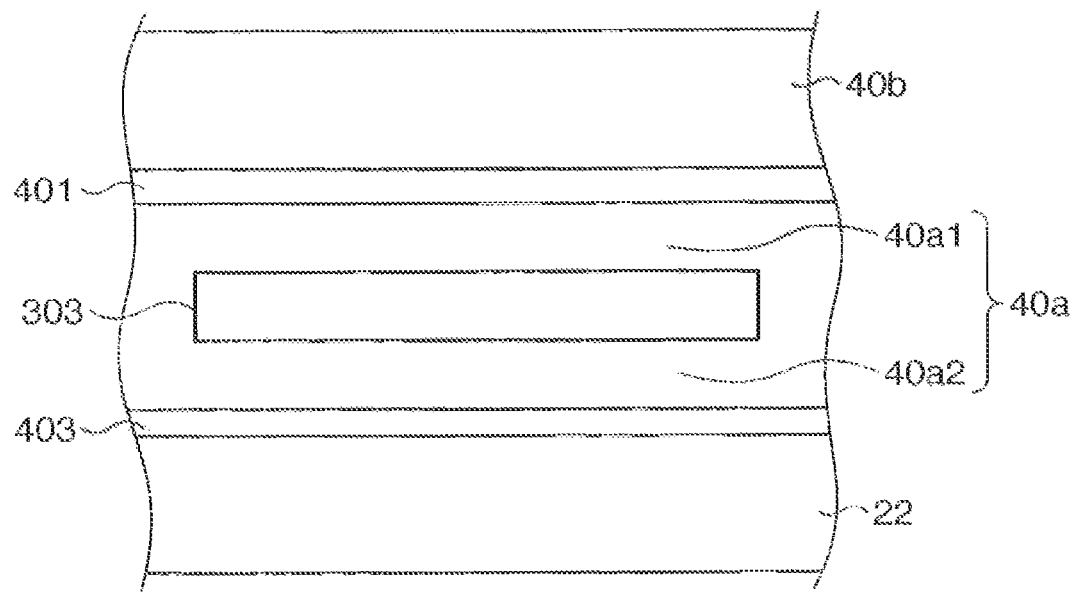
FIG. 4 is a sectional view taken along Y-Y in FIG. 2.

The structure of a shutter storage unit, which is a feature of the present invention, will be explained in detail with reference to FIGS. 2, 3, and 4. FIG. 2 is an enlarged view for explaining the exhaust chamber 8 in detail. FIG. 3 is a sectional view taken along X-X in FIG. 2. FIG. 4 is a sectional view taken along Y-Y in FIG. 2. As shown in FIG. 2, the exhaust chamber 8 incorporates a shutter storage unit 23 which stores the substrate shutter 19 when the substrate shutter 19 retracts from the vacuum chamber 2. The shutter storage unit 23 has an opening 303 for loading/unloading the substrate shutter 19. The shutter storage unit 23 is sealed, except for the opening 303.

As shown in FIG. 3, the shutter storage unit 23 is arranged in the exhaust chamber 8 so that an exhaust region is formed around the shutter storage unit 23 and communicates with the turbo molecular pump 48 via the main valve 47.

FIG. 4 is a view exemplifying the periphery of the opening 303 of the shutter storage unit 23. The shield 40a including shields 40a1 and 40a2, the shield 40b, and a shield 22 are formed cylindrically in the vacuum chamber 2. An exhaust path 401 (first exhaust path) defined between the shields 40a1 and 40b is formed as a gap in the circumferential direction of the cylindrical member at a position above the opening 303 (position of the target holder 6 which forms the deposition unit). An exhaust path 403 (second exhaust path) defined between the shields 40a2 and 22 is formed as a gap in the circumferential direction of the cylindrical member at a position below the opening 303.

The shield 40a has an opening (hole) at a position corresponding to the opening 303 of the shutter storage unit 23 and functions as the first shield which covers the exhaust port. The shield 40b is arranged above the opening 303 of the shutter storage unit 23 and functions as the second shield which covers the exhaust port. The shield 22 is arranged below the opening 303 of the shutter storage unit 23 and functions as the third shield which covers the exhaust port. The exhaust conductance of the exhaust path 403 is changeable along with the movement of the substrate holder 7 by a substrate holder driving mechanism 31.

As shown in FIGS. 2 and 4, the shield 40a1 is fixed around the opening 303 of the shutter storage unit 23 to cover the exhaust port 301 of the exhaust chamber 8. The shields 40a1 and 40b define the exhaust path 401.

The distal end of the shield 40a1 has a U-shaped recess, and the I-shaped shield 40b (projection) is fitted in the U-shaped portion (recess) in a noncontact manner. As a result, the exhaust path 401 is formed as a so-called labyrinth-shaped exhaust path.

The labyrinth-shaped exhaust path 401 also functions as a seal for a non-contact seal. The I-shaped shield 40b (projection) is fitted in the U-shaped portion (recess) formed at the distal end of the shield 40a1, forming a noncontact state, i.e., a predetermined gap between the recess and the projection. The exhaust port 301 of the shutter storage unit 23 is shielded by fitting the projection in the recess. This can prevent particles sputtered from the target from entering the exhaust chamber 8 after passing through the exhaust path 401. As a result, attachment of the particles to the inner wall of the exhaust chamber 8 can be prevented.

Similarly, the shield 40a2 is fixed around the opening 303 of the shutter storage unit 23 to cover the exhaust port 301 of the exhaust chamber 8. The shield 40a2, and the shield 22 coupled to the substrate holder 7 define the exhaust path 403. The distal end of the shield 22 has a U-shaped recess. The I-shaped shield 40a2 (projection) is fitted in the U-shaped portion (recess) in a noncontact manner, forming the exhaust path 403 as a so-called labyrinth-shaped exhaust path. The exhaust port 301 of the shutter storage unit 23 is shielded by fitting the projection of the shield 40a2 in the recess of the shield 22. This can prevent particles sputtered from the target from entering the exhaust chamber 8 after passing through the exhaust path 403. Attachment of the particles to the inner wall of the exhaust chamber 8 can therefore be prevented.

The exhaust conductance of the exhaust path 401 is set to be much larger than that of the exhaust path 403 at a position to which the substrate holder rises, as shown in FIG. 1. That is, gas flowing into the exhaust chamber 8 flows through the exhaust path 401 more easily than the exhaust path 403. When the two exhaust conductances are parallel-connected, the composite conductance equals the sum of the exhaust conductances. Hence, if one exhaust conductance is much larger than the other, the smaller exhaust conductance can be ignored. In the structure of the exhaust paths 401 and 403, the exhaust conductance can be adjusted by the width of the exhaust path and the overlapping distance (length) of the labyrinth shape.

For example, as shown in FIG. 2, the gaps of the exhaust paths 401 and 403 have almost the same width. The overlapping distance (length) of the labyrinth shape of the exhaust path 401 is designed smaller than that of the labyrinth shape of the exhaust path 403. Therefore, the exhaust conductance of the exhaust path 401 is larger than that of the exhaust path 403. Gas introduced from the inert gas introduction system 15 or reactive gas introduction system 17 into the process space (plasma-generated space defined by the shield and target) in the chamber 2 is exhausted mainly via the exhaust path 401. The exhaust conductance from the process space of the chamber 2 to the exhaust chamber 8 is free from the influence of the opening/closing operation of the substrate shutter 19. The main exhaust path from the process space in the chamber 2 to the exhaust chamber 8 is formed at a position where it is not affected by opening/closing of the shutter. Thus, the exhaust conductance from the process space in the chamber 2 to the exhaust chamber 8 does not change when the substrate shutter 19 is opened/closed. The gas pressure in the process space within the vacuum chamber 2, which influences generation of a plasma, can be stabilized when the substrate shutter 19 is opened/closed. Even if the substrate shutter 19 is opened/closed, a change of the exhaust conductance from the vacuum chamber 2 to the exhaust chamber 8 can be suppressed to stabilize the pressure in the vacuum chamber 2 and achieve high-quality deposition.

Referring back to FIG. 1, the overall arrangement of the sputtering deposition apparatus 1 will be described again. A magnet 13 for implementing magnetron sputtering is arranged on the backside of the target 4 when viewed from the sputtering surface. The magnet 13 is held by a magnet holder 3 and can be rotated by a magnet holder rotating mechanism (not shown). The magnet 13 rotates during discharge to uniform erosion of the target.

The target 4 is set at a position (offset position) oblique to the substrate 10. The center point of the sputtering surface of the target 4 is at a position shifted by a predetermined distance from the normal of the center point of the substrate 10. A power supply 12 is connected to the target holder 6 to apply sputtering discharge power. When the power supply 12 applies a voltage to the target holder 6, a discharge starts, depositing sputtered particles on the substrate.

In the embodiment, the sputtering deposition apparatus 1 shown in FIG. 1 includes a DC power supply, but is not limited to this and may include, for example, an RF power supply. When the sputtering deposition apparatus 1 adopts the RF power supply, a matching mechanism needs to be interposed between the power supply 12 and the target holder 6.

An insulator 34 insulates the target holder 6 from the grounded vacuum chamber 2. The target holder 6 made of a metal such as Cu functions as an electrode upon receiving DC or RF power. The target holder 6 incorporates a water channel (not shown) and can be cooled by cooling water supplied from a water pipe (not shown). The target 4 is formed from a material component to be deposited on the substrate 10. The target 4 desirably has high purity because the purity of the target 4 is related to that of a film.

The back plate 5 interposed between the target 4 and the target holder 6 is made of a metal such as Cu and holds the target 4.

In the embodiment, the target holder 6 is installed in the processing chamber and functions as a deposition unit for forming a film on a substrate. The deposition unit is an unit adapted to deposit a deposition source to form a film, and various kinds of units are conceivable depending on the deposition method. For example, the deposition unit may be an unit for forming a film using a CVD method or PVD method. As the CVD method, for example, a photo-assisted CVD method, plasma CVD method, thermal CVD, and heating element CVD method are available. As the PVD method, for example, a sputtering method and thermal vapor deposition method are usable. These methods may be combined to perform deposition according to a plurality of methods.

The target shutter 14 is arranged near the target holder 6 to cover the target holder 6. The target shutter 14 functions as a shield member for setting a closed state in which the target shutter 14 shields the substrate holder 7 and target holder 6 from each other, or an open state in which it releases the space between them.

The target shutter 14 is connected to the target shutter driving mechanism 33 for driving the target shutter 14. The shield 40c is arranged on the substrate side of the target shutter 14. The shield 40c has a hole formed at a portion facing the target holder 6.

A shield member (to be referred to as a "substrate periphery cover ring 21") having a ring shape is arranged at the outer edge of a portion at which the substrate 10 is set on the surface of the substrate holder 7. The substrate periphery cover ring 21 prevents sputtered particles from attaching to a location other than the film deposition surface of the substrate 10 set on the substrate holder 7. A location other than the film deposition surface includes the surface of the substrate holder 7 covered by the substrate periphery cover ring 21 and the side surface and the back surface of the substrate 10. The substrate holder 7 is connected to the substrate holder driving mechanism 31 for vertically moving the substrate holder 7 and rotating it at a predetermined speed. The substrate holder driving mechanism 31 can vertically move the substrate holder 7 so as to move the substrate holder 7 up toward the closed substrate shutter 19 or down backward the substrate shutter 19.

The substrate shutter 19 is interposed between the substrate holder 7 and the target holder 6 near the substrate 10. The substrate shutter 19 is supported by a substrate shutter support member 20 so as to cover the upper surface of the substrate 10. The substrate shutter driving mechanism 32 rotates and translates the substrate shutter support member 20 to insert the substrate shutter 19 between the target 4 and the substrate 10 at a position near the substrate surface (closed state). The target 4 and substrate 10 are shielded from each other by inserting the substrate shutter 19 between them. When the substrate shutter driving mechanism 32 operates to retract the substrate shutter 19 from between the target holder 6 (target 4) and the substrate holder 7 (substrate 10), the space between the target holder 6 (target 4) and the substrate holder 7 (substrate 10) is released (open state). The substrate shutter driving mechanism 32 drives the substrate shutter 19 to open or close so as to set the closed state in which the substrate shutter 19 shields the substrate holder 7 and the target holder 6 from each other, or the open state in which it releases the space between them. In the open state, the shutter storage unit 23 stores the substrate shutter 19. The apparatus area can be preferably decreased when the retracted location of the substrate shutter 19 falls within the conduit of the exhaust path extending to the high-vacuum turbo molecular pump 48, as shown in FIG. 1.

The substrate shutter 19 is made of a stainless alloy or aluminum alloy. When heat resistance is required, the substrate shutter 19 is sometimes formed from titanium or a titanium alloy. The surface of the substrate shutter 19, at least a surface facing the target 4 undergoes blasting such as sand blasting and has small corrugations. This structure can make it difficult for a film attached to the substrate shutter 19 to peel off, reducing particles generated upon peeling. Note that a metal thin film may be formed on the surface of the substrate shutter 19 by metal spraying or the like, other than blasting. Thermal spraying is more expensive than blasting, but is advantageous because an attached film including a thermal sprayed film can be removed in maintenance when dismounting the substrate shutter 19 and removing the attached film. Further, a thermal sprayed thin film relaxes the stress of a sputtered film, preventing peeling of the film.

Figure 5:
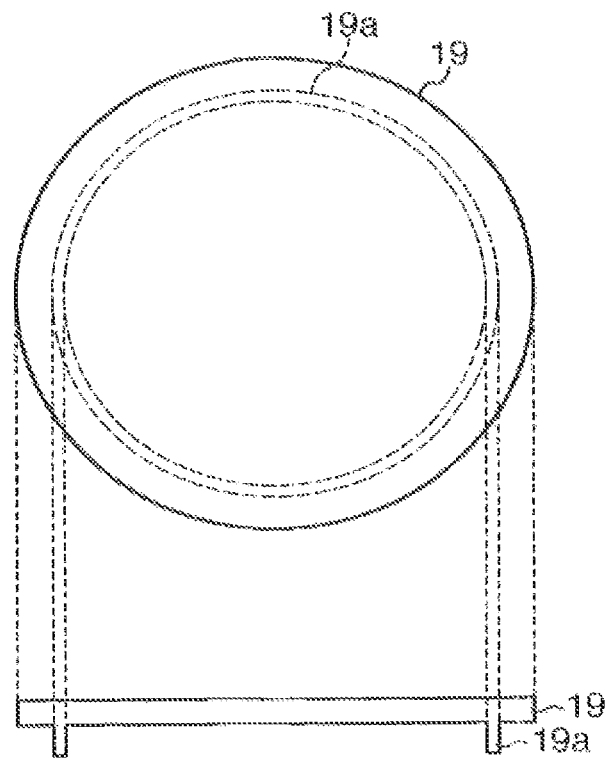
FIG. 5 is a view showing the schematic structure of a substrate shutter 19.
Figure 6:
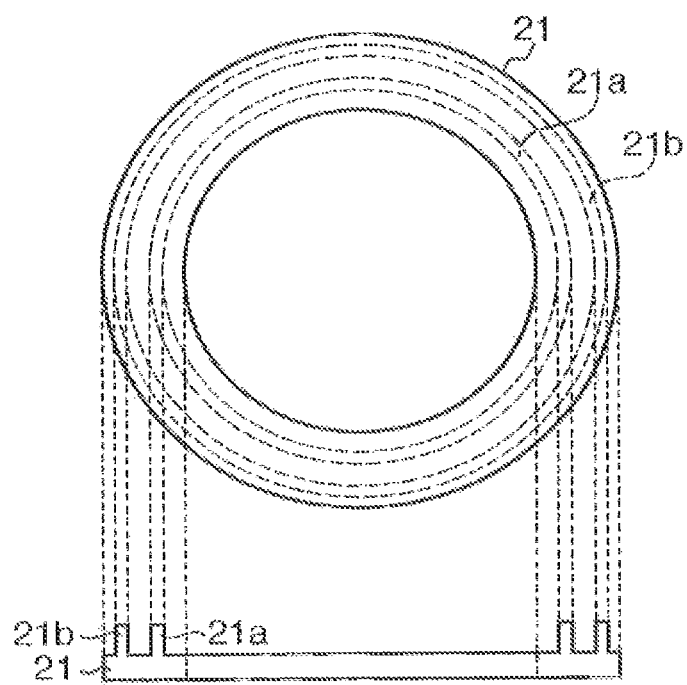
FIG. 6 is a view showing the schematic structure of a substrate periphery cover ring 21.

The shapes of the substrate periphery cover ring 21 and substrate shutter 19 will be explained in detail with reference to FIGS. 5 and 6. FIG. 5 is a view showing the schematic structure of the substrate shutter 19 facing the substrate periphery cover ring 21. The substrate shutter 19 has a ring-like projecting portion (projection 19a) extending toward the substrate periphery cover ring 21. FIG. 6 is a view showing the schematic structure of the substrate periphery cover ring 21 facing the substrate shutter 19. The substrate periphery cover ring 21 has a ring-like projecting portion extending toward the substrate shutter 19. The substrate periphery cover ring 21 has a ring shape, and a surface of the substrate periphery cover ring 21 that faces the substrate shutter 19 has concentric projecting portions (projections 21a and 21b).

The projection 19a is fitted between the projections 21a and 21b in a noncontact manner at a position to which the substrate holder driving mechanism 31 moves up the substrate holder 7. Alternatively, the projection 19a is fitted between the projections 21a and 21b in a noncontact manner at a position to which the substrate holder driving mechanism 31 moves down the substrate holder 7. In this case, the projection 19a is fitted in a recess formed by the projections 21a and 21b in a noncontact manner.

Figure 7:
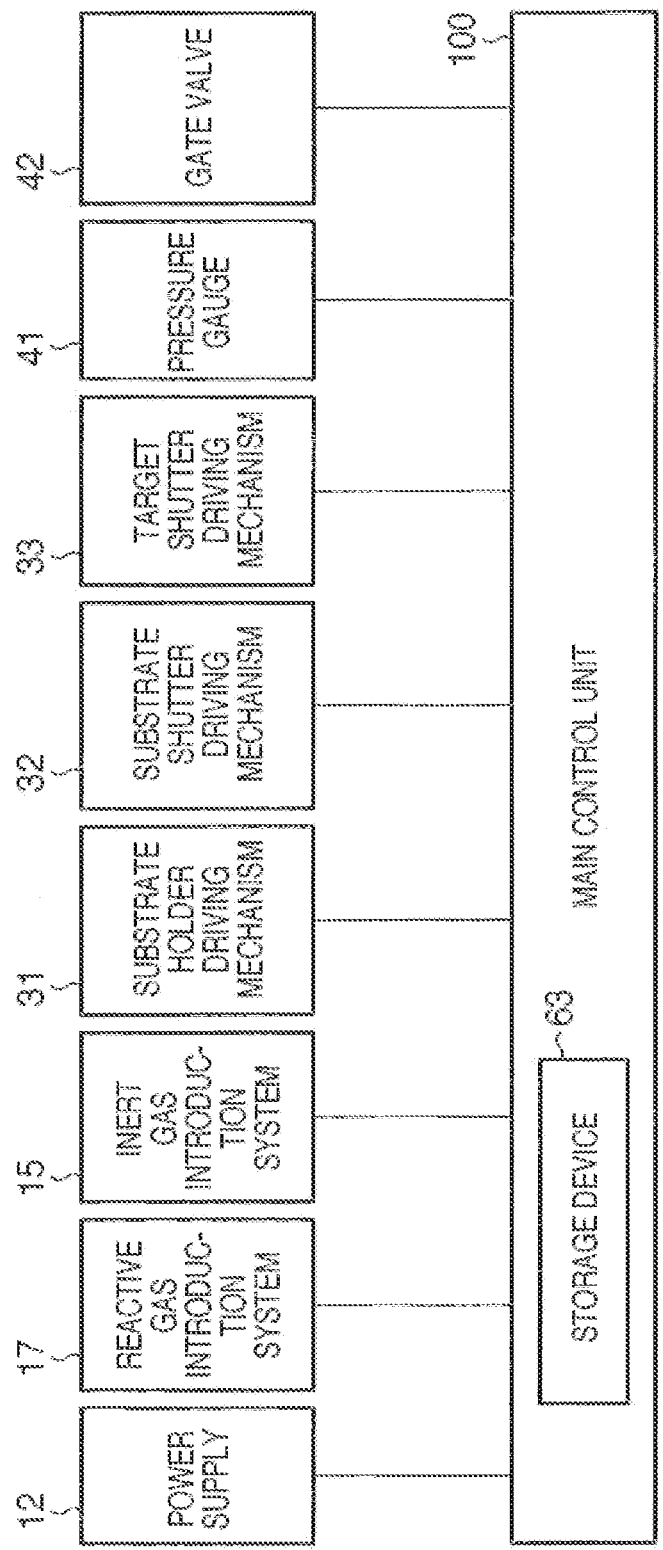
FIG. 7 is a block diagram of a main control unit for operating the sputtering deposition apparatus.

FIG. 7 is a block diagram of a main control unit 100 for operating the sputtering deposition apparatus 1 shown in FIG. 1. The main control unit 100 is electrically connected to the power supply 12 for applying sputtering discharge power, the inert gas introduction system 15, the reactive gas introduction system 17, the substrate holder driving mechanism 31, the substrate shutter driving mechanism 32, the target shutter driving mechanism 33, a pressure gauge 41, and a gate valve 42. The main control unit 100 can manage and control the operation of the sputtering deposition apparatus 1 (to be described later).

A storage device 63 in the main control unit 100 stores a control program for executing, e.g., a method of deposition on a substrate according to the present invention, including conditioning and sputtering. For example, the control program is implemented as a mask ROM. The control program can also be installed in the storage device 63 formed from a hard disk drive (HDD) or the like via an external recording medium or network.

Figure 8:
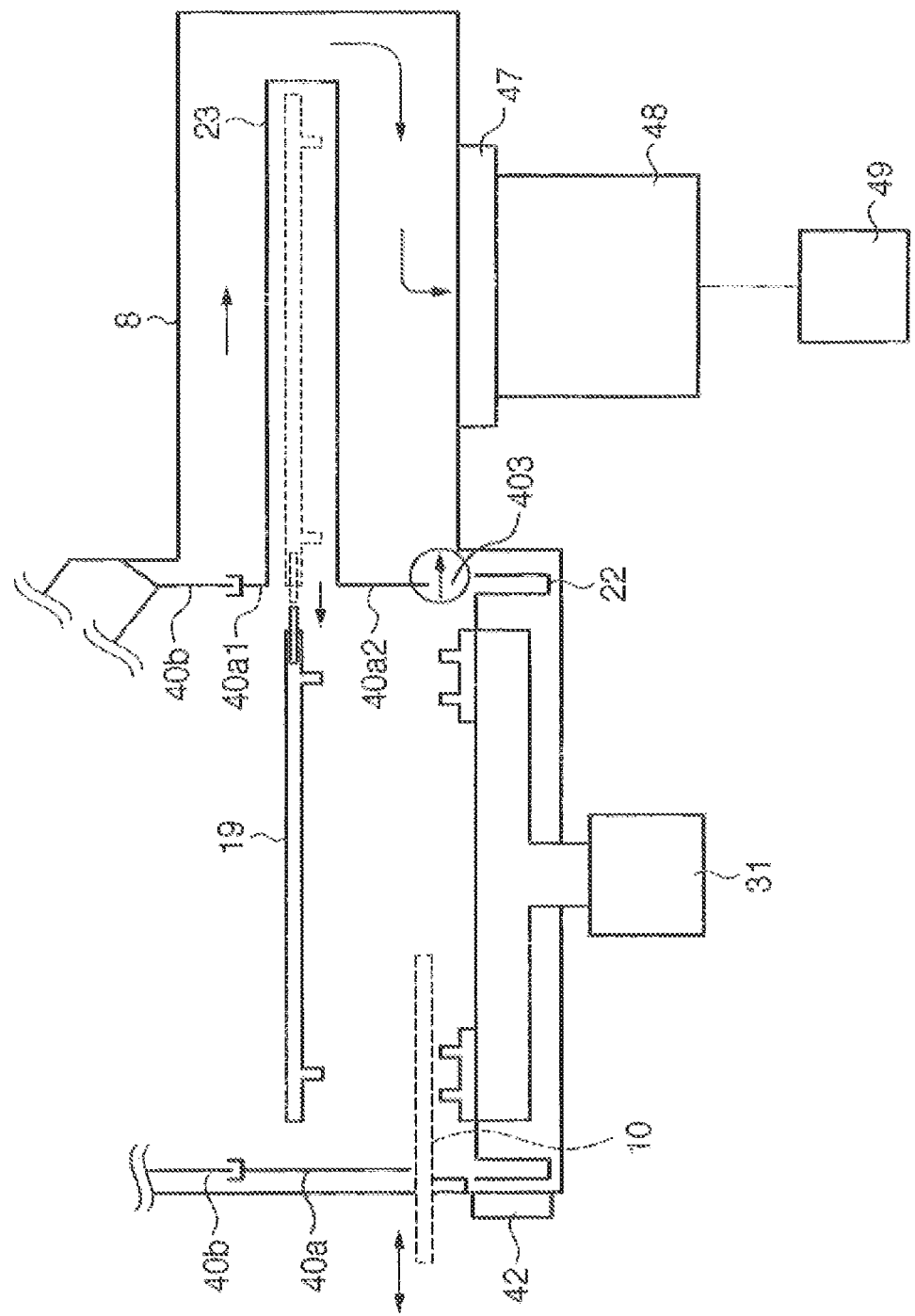
FIG. 8 is a schematic view for explaining the operation of the sputtering deposition apparatus when unloading/loading a substrate.

FIG. 8 is a schematic view for explaining the operation of the sputtering deposition apparatus 1 when unloading/loading a substrate. When the gate valve 42 is opened, a substrate transport robot (not shown) unloads/loads the substrate 10. The shield 22 having a U-shaped distal end is connected to the substrate holder 7. The substrate holder driving mechanism 31 drives the substrate holder 7 to move down. Then, the labyrinth formed by the shields 22 and 40a2 is released to increase the conductance of the exhaust path 403. As a result, gas flows through the exhaust path 403 more easily than the exhaust path 401. The exhaust path 403 can be used in unloading/loading the substrate, and exhaust processing can be effectively done even within a short time during which the substrate is unloaded/loaded.

The sputtering deposition apparatus 1 according to the embodiment of the present invention is used to manufacture an electronic device such as a semiconductor memory, DRAM, SRAM, nonvolatile memory, MRAM, arithmetic element, CPU, DSP, image input element, CMOS sensor, CCD, video output element, or liquid display device.

Figure 9:
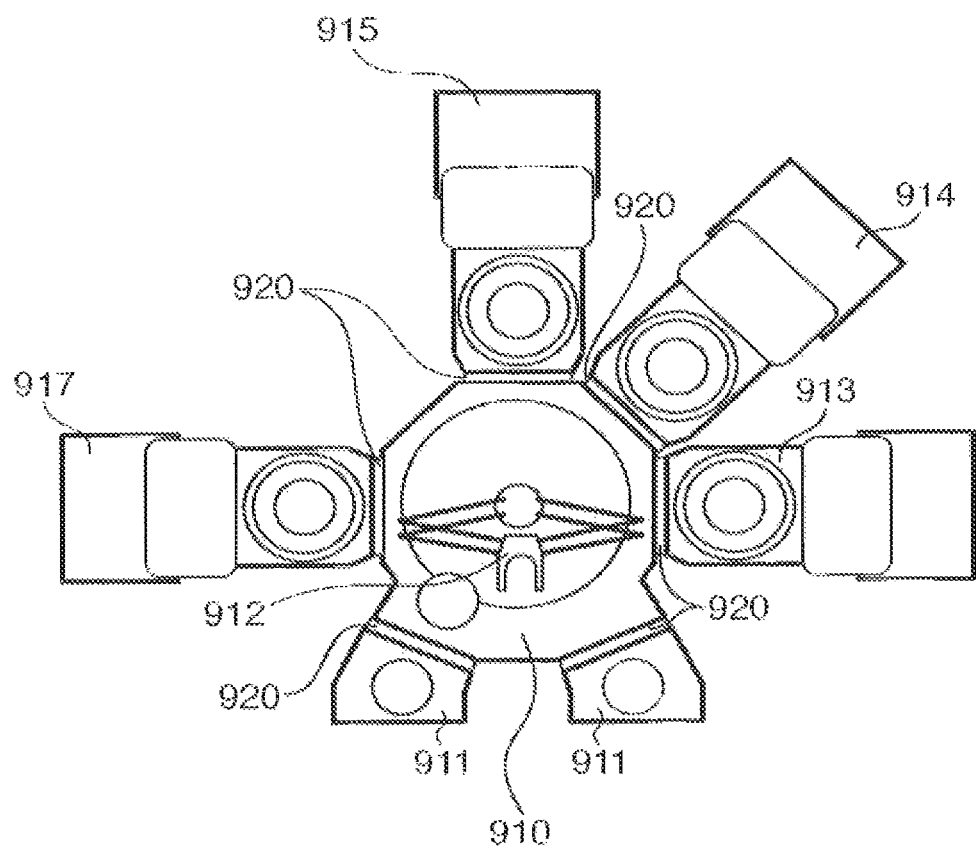
FIG. 9 is a view showing the schematic arrangement of a stacked film forming apparatus for a flash memory as an example of a vacuum thin film forming apparatus including the sputtering deposition apparatus according to the embodiment of the present invention.

FIG. 9 is a view showing the schematic arrangement of a stacked film forming apparatus for a flash memory (to be also simply referred to as a "stacked film forming apparatus") as an example of a vacuum thin film forming apparatus including the sputtering deposition apparatus 1 according to the embodiment of the present invention. The stacked film forming apparatus shown in FIG. 9 includes a vacuum transport chamber 910 incorporating a vacuum transport robot 912. The vacuum transport chamber 910 is coupled to a load lock chamber 911, substrate heating chamber 913, first PVD (sputtering) chamber 914, second PVD (sputtering) chamber 915, and substrate cooling chamber 917 via gate valves 920.

The operation of the stacked film forming apparatus shown in FIG. 9 will be explained. A substrate (silicon wafer) to be processed is set in the load lock chamber 911 for unloading/loading the substrate to be processed from/into the vacuum transport chamber 910. The load lock chamber 911 is evacuated until the pressure reaches $1 \times 10^{-4}$ Pa or less. By using the vacuum transport robot 912, the substrate to be processed is loaded into the vacuum transport chamber 910 maintained at a vacuum of $1 \times 10^{-6}$ Pa or less, and then transported to a desired vacuum processing chamber.

In the embodiment, the substrate to be processed is first transported to the substrate heating chamber 913 to heat it to 400° C. Then, the substrate to be processed is transported to the first PVD (sputtering) chamber 914 to deposit an $Al_2O_3$ thin film to a thickness of 15 nm on the substrate to be processed. After that, the substrate to be processed is transported to the second PVD (sputtering) chamber 915 to deposit a TiN film to a thickness of 20 nm on the substrate. Finally, the substrate to be processed is transported to the substrate cooling chamber 917 to cool it to room temperature. After the end of all processes, the substrate to be processed is returned to the load lock chamber 911. After dry nitrogen gas is introduced into the load lock chamber 911 to reach the atmospheric pressure, the substrate to be processed is unloaded from the load lock chamber 911.

In the stacked film forming apparatus of the embodiment, the vacuum of the vacuum processing chamber is set to $1 \times 10^{-6}$ Pa or less. The embodiment adopts magnetron sputtering to deposit an $Al_2O_3$ film and TiN film.

Figure 10:
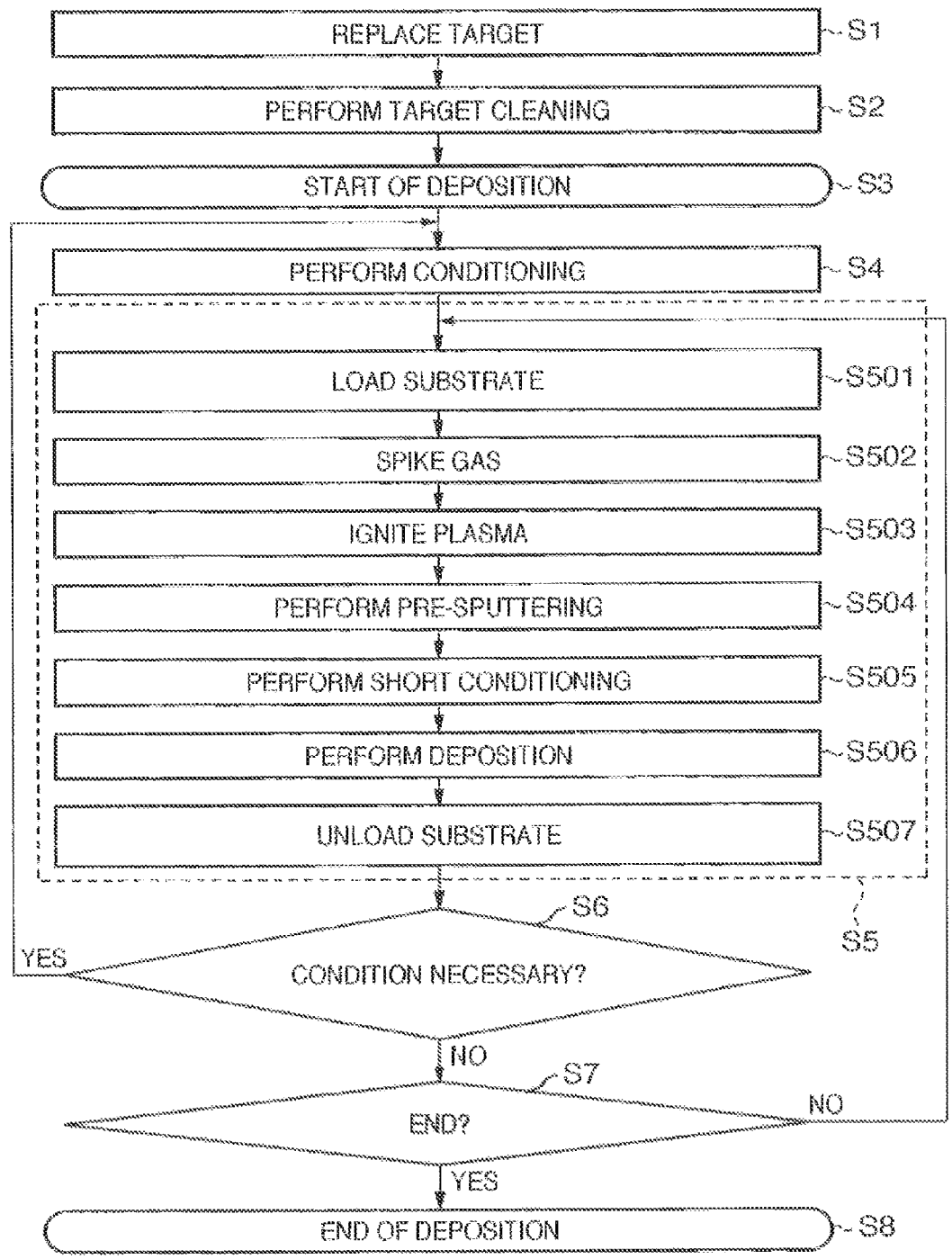
FIG. 10 is a flowchart exemplifying a sequence to process an electronic device product using the sputtering deposition apparatus according to the embodiment of the present invention.

FIG. 10 is a flowchart exemplifying an electronic device product processing sequence based on the electronic device manufacturing method using the sputtering deposition apparatus 1 according to the embodiment of the present invention. In the following example, Ti is used as the target 4 set in the sputtering deposition apparatus 1, argon is used as inert gas, and nitrogen is used as reactive gas.

In step S1, the target and shield are replaced, and then the vacuum chamber 2 is evacuated and controlled at a predetermined pressure. At the predetermined pressure, target cleaning starts in step S2 while the target shutter 14 and substrate shutter 19 are closed. Target cleaning means sputtering for removing an impurity and oxide attached to the target surface. In target cleaning, the level of the substrate holder is set so that the substrate shutter 19 and substrate periphery cover ring 21 form a labyrinth seal. This setting can prevent attachment of sputtered particles to the substrate support surface of the substrate holder. Target cleaning may be executed while setting the substrate on the substrate holder.

In step S3, the main control unit 100 starts a deposition operation in accordance with a deposition start instruction input to the main control unit 100 via an input device (not shown).

After the start of deposition in step S3, conditioning is done in step S4. In conditioning, a discharge is generated to sputter the target and make the sputtered particles attach to the inner wall of the chamber and the like.

The conditioning will be explained in more detail. FIG. 11 is a table showing procedures when performing conditioning using the sputtering deposition apparatus 1. More specifically, the table shows the step number, the time (set time) of each processing, target shutter position (open/closed), substrate shutter position (open/closed), target application power, the Ar gas flow rate, and nitrogen gas flow rate. These procedures are stored in the storage device 63 and successively executed by the main control unit 100.

The deposition procedures will be described with reference to FIG. 11. First, gas is spiked (S1101). In this step, the pressure in the chamber is increased to facilitate the start of discharge in the next plasma ignition step. As conditions in this step, the target shutter 14 and substrate shutter 19 are closed, the nitrogen gas flow rate is 0, and the argon gas flow rate is 400 sccm. The argon gas flow rate is preferably 100 sccm or more for easy ignition in the next plasma ignition step.

Thereafter, the plasma ignition step is performed (S1102). A plasma is generated by applying a 1,000-W DC power to the Ti target while maintaining the shutter positions and gas conditions (plasma ignition). Under these gas conditions, a plasma generation error, which readily occurs at low pressure, can be prevented.

Pre-sputtering is then performed (S1103). In pre-sputtering, the gas condition is changed to 100 sccm for argon while maintaining the power (target application power) applied to the target. By this procedure, the discharge can be maintained without losing the plasma.

Next, conditioning 1 is done (S1104). In conditioning 1, the target shutter 14 is opened while maintaining the target application power, the gas flow rate conditions, and the substrate shutter 19 at a closed position. In response to this, particles sputtered from the Ti target attach to the inner wall of the chamber including that of the shield, covering the inner wall of the shield with a low-stress film. Since peeling of the sputtered film from the shield can be prevented, degradation of product characteristics by the peeled film which scatters in the chamber and drops on the device can be prevented.

Gas is spiked again (S1105). In the gas spike step, the application of power to the target stops, the argon gas flow rate is changed to 200 sccm, and the nitrogen gas flow rate is changed to 10 sccm. The argon gas flow rate is preferably higher than that in the conditioning 2 step (S1108: to be described later), e.g., 100 sccm or higher in order to facilitate ignition in the subsequent plasma ignition step. In the conditioning 2 step (S1108: to be described later), a nitride film is deposited according to reactive sputtering by introducing nitrogen gas. Hence, introducing nitrogen gas in the gas spike step can effectively prevent an abrupt change of the gas flow rate.

After that, the plasma ignition step is executed (S1106). A plasma is generated by applying a 750-W DC power to the Ti target while maintaining the shutter positions and gas flow rate conditions (plasma ignition). Under these gas conditions, a plasma generation error, which readily occurs at low pressure, can be prevented.

Pre-sputtering is then performed (S1107). In pre-sputtering, the gas flow rate conditions are changed to 10 sccm for argon and 10 sccm for nitrogen while maintaining the target application power. By this procedure, the discharge can be maintained without losing the plasma.

Subsequently, conditioning 2 is done (S1108). In conditioning 2, the target shutter 14 is opened while maintaining the target application power, the gas flow rate conditions, and the substrate shutter 19 at a closed position. Then, particles sputtered from the Ti target and nitrogen reactive gas react with each other. Consequently, the nitride film attaches to the inner wall of the chamber including that of the shield, suppressing an abrupt change of the gas state in the chamber when the process shifts to the next substrate deposition step. By suppressing an abrupt change of the gas state in the chamber, deposition in the next substrate deposition step can be stably done from the beginning. The manufacturing stability in the device manufacture can therefore be greatly improved.

The time necessary for each procedure is set to an optimum value. In the embodiment, the time in the first gas spike (S1101) is set to 0.1 sec, that in plasma ignition (S1102) is set to 2 sec, that in pre-sputtering (S1103) is set to 5 sec, that in conditioning 1 (S1104) is set to 240 sec, that in the second gas spike (S1105) is set to 5 sec, that in the second plasma ignition (S1106) is set to 2 sec, that in the second pre-sputtering is set to 5 sec, and that in conditioning 2 (S1108) is set to 180 sec.

The second gas spike step (S1105), subsequent plasma ignition step (S1106), and pre-sputtering step (S1107) can be omitted. The omission of these steps is desirable because the conditioning time can be shortened. However, when the conditioning 2 step (S1108) of adding nitrogen gas is executed immediately after the conditioning 1 step (S1104) of generating an argon gas discharge, the properties of the plasma change greatly while the discharge continues. In the transient state, particles may increase. In this case, the steps (S1105, S1106, and S1107) including a temporary step of the discharge and replacement of gas are inserted between the conditioning 1 step (S1104) and the conditioning 2 step (S1108). Accordingly, abrupt variations of the plasma characteristics during conditioning can be further suppressed, reducing the risk of generating particles.

Note that conditions in conditioning 2 (S1108) of performing reactive sputtering are desirably almost the same as conditions of deposition on a substrate (to be described later). By setting almost the same conditions in conditioning 2 (S1108) as conditions of deposition on a substrate in the product manufacturing step, deposition on a substrate in the product manufacturing step can be stably achieved with good reproducibility.

Referring back to FIG. 10, step S5 including deposition processing on a substrate is executed after conditioning (S4). The procedures of deposition processing that form step S5 will be explained with reference to FIG. 10.

First, a substrate is loaded (S501). In the substrate loading step (S501), the gate valve 42 is opened. The substrate 10 is loaded into the vacuum chamber 2 and placed on the substrate support surface on the substrate holder 7 by the substrate transport robot (not shown) and lift mechanism (not shown). While supporting the substrate, the substrate holder 7 moves up to a deposition position.

Then, gas is spiked (S502). In the gas spike step (S502), argon gas and nitrogen gas are introduced at 200 sccm and 10 sccm, respectively, while the target shutter 14 and substrate shutter 19 are closed. It is desirable in terms of an easy start of discharge that the volume of gas at this time is larger than that of argon gas introduced in the deposition step (S506: to be described later). The time taken for the gas spike step (S502) suffices to be long enough to ensure a pressure necessary in the next ignition step (S503) and is, e.g., about 0.1 sec.

After that, a plasma is ignited (S503). In the plasma ignition step (S503), a discharge plasma is generated near the sputtering surface of the target by applying, e.g., 750-W direct-current (DC) power to the target 4 while keeping the target shutter 14 and substrate shutter 19 closed, and the flow rates of argon gas and nitrogen gas unchanged from the conditions in the gas spike step (S502). The time taken for the plasma ignition step (S503) suffices to be long enough to ignite a plasma and is, e.g., 2 sec.

Pre-sputtering is then performed (S504). In the pre-sputtering step (S504), the argon gas flow rate is decreased to, e.g., 10 sccm and the nitrogen gas flow rate is set to 10 sccm while keeping the target shutter 14 and substrate shutter 19 closed. At this time, the direct-current (DC) power to the target is, e.g., 750 W and the discharge is maintained. The time taken for the pre-sputtering step (S504) suffices to be long enough to prepare for the next short conditioning and is, e.g., 5 sec.

Subsequently, short conditioning is executed (S505). In the short conditioning step (S505), the target shutter 14 is opened while keeping the substrate shutter 19 closed, the argon gas flow rate at 10 sccm, and the nitrogen gas flow rate at 10 sccm. At this time, the direct-current (DC) power to the target is, e.g., 750 W and the discharge is maintained. In this short conditioning, a titanium nitride film is deposited on the inner wall of the shield and the like, which is effective for deposition in a stable atmosphere in the next step of deposition on a substrate (S506). To enhance this effect, deposition is desirably performed under almost the same conditions as discharge conditions in the next step of deposition on a substrate (S506). The time taken for the short conditioning step (S505) suffices to be shorter than those taken for the preceding conditioning 1 (S1104) and conditioning 2 (S1108) because the atmosphere has been conditioned in the preceding conditioning (S4). The time taken for the short conditioning step (S505) is, e.g., about 5 to 30 sec.

Thereafter, the discharge is maintained by keeping the conditions of argon gas, nitrogen gas, and direct-current power unchanged from those in the short conditioning step (S505). While keeping the target shutter 14 open, the substrate shutter 19 is opened to start deposition on the substrate (S506). More specifically, the conditions of deposition on the substrate 10 are a 10-sccm argon gas flow rate, 10-sccm nitrogen gas flow rate, 750-W direct-current power applied to the target. At this time, the exhaust conductance of the exhaust path 401 is larger than that of the exhaust path 403, so gas is exhausted mainly via the exhaust path 401. The exhaust conductance of the process space (plasma-generated space defined by the shield and target) in the chamber 2 when gas is exhausted mainly via the exhaust path 401 is almost free from the influence of the opening/closing operation of the substrate shutter 19. Gas is exhausted to the exhaust chamber 8 via the exhaust path 401 because the shutter storage unit 23 suppresses a change of the exhaust conductance from the process space to the exhaust device when the substrate shutter 19 changes from the closed state to the open state. Hence, variations of the plasma characteristics upon fluctuations of the pressure in the process space can be suppressed at the start of deposition on the substrate by opening the substrate shutter 19 while maintaining the discharge. By suppressing variations of the plasma characteristics upon pressure fluctuations, deposition on the substrate can start stably. Especially when the interface characteristic is important as in a case in which a gate electrode is formed on a gate insulating film in the manufacture of a gate stack, the device characteristics and manufacturing stability in the device manufacture can be considerably improved.

After the end of deposition S506 on the substrate by stopping power to the target 4, substrate unloading S507 is executed. In substrate unloading S507, the substrate holder 7 moves down, the gate valve 42 is opened, and the substrate transport robot (not shown) and lift mechanism (not shown) unload the substrate 10.

The main control unit 100 determines whether conditioning is necessary (S6). In the conditioning necessity determination step (S6), the main control unit 100 determines, based on a determination condition stored in the storage device 63, whether conditioning is necessary. If the main control unit 100 determines that conditioning is necessary, the process returns to step S4 to perform conditioning again (S4). If the main control unit 100 determines in step S6 that conditioning is not necessary, the process advances to the next end determination in S7. In step S7, the main control unit 100 makes determination based on whether the main control unit 100 has received an end signal and whether there is a substrate to be supplied to the apparatus for processing. If the main control unit 100 determines not to end the process (NO in S7), the process returns to step S501 to perform substrate loading (S501) to substrate unloading (S507) via deposition (S506) again. In this fashion, processing of deposition on a product substrate continues for a predetermined number of films, e.g., several hundred films.

An example in which it is determined in the conditioning necessity determination step (S6) to start conditioning will be explained. After processing is continuously done, the standby time may be generated owing to, e.g., the time to wait for a product. If it is determined based on the determination condition stored in the storage device 63 that the standby time requiring conditioning has been generated, the main control unit 100 determines that conditioning is necessary, and executes conditioning in step S4 again. By this conditioning, a low-stress film of Ti or the like can cover the upper surface of a high-stress film of TiN or the like attached to the inner surface of the shield. If TiN continuously attaches to the shield, the film peels off and acts as particles because the stress of the TiN film is high and adhesion to the shield is weak. To prevent peeling of the film, Ti sputtering is executed.

The Ti film has high adhesion to the shield and TiN film and exhibits an effect of preventing peeling of the TiN film (wall paint effect). For sputtering on the entire shield, the substrate shutter can be effectively used. In the sputtering deposition apparatus 1 according to the embodiment of the present invention, the substrate shutter 19 and substrate periphery cover ring 21 form a labyrinth seal. Thus, conditioning can be done without depositing a sputtered film on the substrate support surface of the substrate holder. After the conditioning, deposition processing S5 (S501 to S507) is executed again.

After conditioning is performed in the above-described way, the product processing procedures are repeated till the end of the service life of the target. Maintenance is done to replace the shield and target, and then the process is repeated from initial target cleaning.

According to these procedures, an electronic device can be manufactured without attaching a sputtered film to the substrate support surface of the substrate holder while preventing peeling of a film attached to the shield. In the embodiment, maintenance is executed at the end of the service life of the target. Even in maintenance for replacing the shield, the same operation is done. In the above description, conditioning starts upon generation of the standby time. However, the conditioning start condition (condition to determine whether conditioning is necessary) is not limited to the above example.

FIG. 12 is a table for explaining exemplary conditioning start conditions (conditions to determine whether conditioning is necessary). The conditions to determine whether to start conditioning are changes of deposition conditions depending on the total number of processed substrates, the total number of processed lots, the total thickness of a deposited film, electric energy applied to the target, electric energy applied to the target for deposition on the shield after the replacement of the shield, the standby time, and a change of an electronic device to be processed.

The conditioning start timing can be set to the end of processing a lot (a bundle of substrates set for convenience of management of the manufacturing process; one lot generally includes 25 substrates). When a plurality of lots (processing lots) are to be processed, the total number of processing lots serves as the determination condition. The end of processing all lots can be set as the conditioning start timing (conditioning start timings 1, 3, 5, 7, 9, and 11). Alternatively, when one of the foregoing determination conditions except for the condition concerning the lot is satisfied even during processing of a lot, the processing can be interrupted to start conditioning (conditioning start timings 2, 4, 6, 8, 10, and 12).

A method (1201) of making determination based on the total number of processed substrates is advantageous because conditioning intervals remain equal even if the number of substrates of a lot changes. A method (1202) of making determination based on the total number of processing lots is advantageous because the conditioning time can be predicted when production control is done based on the number of lots.

A method (1203) of making determination based on the thickness of a film deposited by the deposition apparatus is advantageous because conditioning can be executed at an appropriately timing when peeling of the film from the shield depends on an increase in film thickness. A method (1204) of making determination based on integral power to the target is advantageous because conditioning can be executed at an appropriately timing when the target surface changes depending on deposition processing. A method (1205) of making determination based on integral power per shield is advantageous because conditioning can be executed at an appropriately timing even when the cycles of shield replacement and target replacement shift from each other. A method (1206) of making determination based on the standby time is effective because the deposition characteristics can be stabilized in a good state when the residual gas concentration and temperature in the deposition chamber change during the standby time and the deposition characteristics may be impaired. A method (1207) using, as a determination condition, a change of the conditions of deposition on the substrate (product manufacturing conditions) is effective because a film can be stably deposited on the substrate even upon a change of the deposition conditions. A change of the deposition conditions changes the state of the inner wall surface of the shield and that of the target surface. These changes lead to variations of the gas composition and variations of electrical properties depending on the gettering performance of the inner wall surface of the shield and the target surface. As a consequence, the characteristics of deposition on the substrate vary within the lot. The method (1207) using, as a determination condition, a change of the conditions of deposition on the substrate (product manufacturing conditions) has an effect of suppressing such an error.

The method of executing conditioning after lot processing has an effect of preventing interruption of lot processing when the production is controlled for each lot (conditioning start timings 1, 3, 5, 7, 9, and 11). The method of interrupting lot processing to perform conditioning has an advantage of executing conditioning at an accurate conditioning timing (conditioning start timings 2, 4, 6, 8, 10, and 12). When a change of the deposition conditions serves as a determination condition, conditioning is executed before lot processing (conditioning start condition 13).

Figure 13:
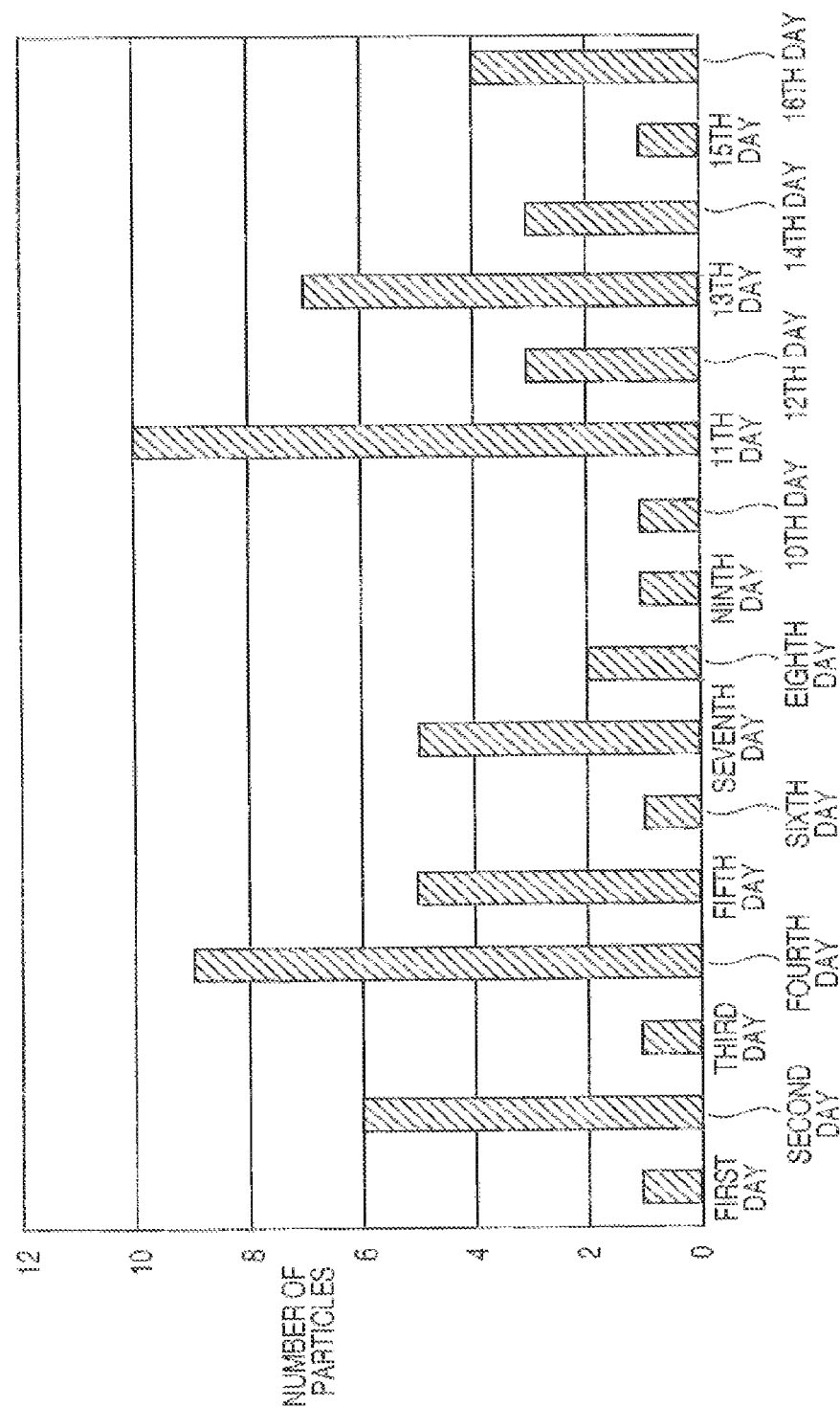
FIG. 13 is a table showing the result of measuring once a day the number of particles attached to a substrate when the processing in FIG. 10 was performed using the sputtering deposition apparatus according to the embodiment of the present invention.

FIG. 13 is a table showing the result of measuring once a day the number of particles attached to a substrate when the processing in FIG. 10 was performed using the sputtering deposition apparatus 1 according to the embodiment of the present invention. The abscissa axis indicates the measurement date, and the ordinate axis indicates the number of particles 0.09 μm or larger in size that were observed on a 300-mmφ silicon substrate. The number of particles was measured using a surface inspection apparatus "SP2" (tradename) available from KLA-Tencor. These data reveal that the number of particles could be suppressed as very small as 10 or smaller per substrate for a relatively long term of 16 days.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-305567, filed Nov. 28, 2008, which is hereby incorporated by reference herein in its entirety.

The invention claimed is:
1. An electronic device manufacturing method using a deposition apparatus including:
   a processing chamber configured to perform deposition processing;
   an exhaust chamber connected to the processing chamber;

an exhaust device which evacuates the processing chamber via the exhaust chamber;

a substrate holder which is disposed in the processing chamber and supports a substrate;

a target holder configured to hold a target which is disposed in the processing chamber;

a shutter configured to move to a shielding state in which the shutter shield a gap between the substrate holder and the target holder, or a retracted state in which the shutter is retracted from the gap between the substrate holder and the target holder;

a driving unit configured to drive the shutter; and a shutter storage unit which has an opening portion through which the shutter is extended to the processing chamber or retracted from the processing chamber, wherein a portion of the shutter storage unit other than the opening portion is sealed;

wherein an exhaust port is formed between a periphery of the opening portion of the shutter storage unit and an inner wall of the exhaust chamber;

the shutter storage unit is placed in the exhaust chamber such that the exhaust chamber is adjacent to the processing chamber and the exhaust chamber communicates with the processing chamber via the exhaust port, and an exhaust region is formed outside the shutter storage unit and inside the exhaust chamber and the exhaust region communicates with the exhaust device, and a gas introduced in the processing chamber is evacuated by the exhaust device via the exhaust region, and the shutter, when in the retracted state, is retracted from the processing chamber into the shutter storage unit, the method comprising:

(a) evacuating, by the exhaust device, the processing chamber via the exhaust port and the exhaust region, and controlling the processing chamber at a predetermined pressure;

(b) setting, by driving the driving unit, the shutter from the retracted state to the shielding state, the shutter having been stored in the shutter storage unit in such a manner as to be separated from the exhaust chamber;

(c) depositing a film from the target after (b) while maintaining the shielding state; and (d) setting the shutter in the retracted state by the driving unit after (c), and depositing a film from the target on the substrate supported by the substrate holder.

2. The electronic device manufacturing method according to claim 1, wherein the deposition apparatus further includes a target shutter which is configured to be opened and closed between the target and the substrate, an open/closed position of the target shutter being closer to the target than a position of the shutter in the shielding state, and a target shutter driving unit which drives the target shutter, and the depositing step includes a conditioning step of opening the target shutter by the target shutter driving unit and sputtering the target.

* * * * *